United States Patent
Conboy et al.

[19]

[11] Patent Number: 6,154,043
[45] Date of Patent: *Nov. 28, 2000

[54] METHOD AND APPARATUS FOR IDENTIFYING THE POSITION OF A SELECTED SEMICONDUCTOR DIE RELATIVE TO OTHER DICE FORMED FROM THE SAME SEMICONDUCTOR WAFER

[75] Inventors: Michael R. Conboy; Elfido Coss, Jr., both of Austin, Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,316

[22] Filed: May 7, 1997

[51] Int. Cl.$^7$ .................................................. G01R 31/02
[52] U.S. Cl. ........................................ 324/764; 324/158.1
[58] Field of Search ................................ 324/529, 158.1, 324/764, 633, 652, 682, 713, 719

[56] References Cited

U.S. PATENT DOCUMENTS

| | | | |
|---|---|---|---|
| 3,624,494 | 11/1971 | Turan | 324/653 |
| 3,753,089 | 8/1973 | Gunn | 324/133 |
| 3,906,340 | 9/1975 | Wingfield et al. | 324/682 |
| 4,086,527 | 4/1978 | Cadot | 324/233 |
| 5,073,754 | 12/1991 | Henley | 324/529 |
| 5,214,409 | 5/1993 | Beigel | 340/572 |
| 5,218,294 | 6/1993 | Soiferman | 324/158 |

OTHER PUBLICATIONS

Greenhouse, H.M., "Design of Planar Rectangular Microelectronic Inductors," IEEE transactions on Parts, Hybrids, and Packaging, vol. PHP–10, No. 2, Jun. 1974, pp. 101–109.

Gupta, K.C. et al., "Computer–Aided Design of Microwave Circuits," Artech House, Inc., 1981, pp. 209–212. (Month Unavailable).

*Primary Examiner*—Safet Metjahic
*Assistant Examiner*—Russell M. Kobert
*Attorney, Agent, or Firm*—Kevin L. Daffer; Conley, Rose & Tayon

[57] ABSTRACT

An apparatus and method are presented for identifying a semiconductor die within a group of semiconductor dice formed upon a surface of the same semiconductor wafer. During wafer fabrication, several parallel-resonant electronic structures are formed within each die area of the semiconductor wafer. The parallel-resonant structures are configured such that each semiconductor die responds differently to an alternating current (a.c.) electrical signal. During an identification operation, an a.c. electrical signal is coupled to the parallel-resonant structures of a selected semiconductor die. The unique response of the parallel-resonant structures of the selected semiconductor die to the a.c. electrical signal is used to determine the position of the selected semiconductor die relative to other semiconductor dice formed from the same semiconductor wafer. The apparatus includes a includes a variable frequency oscillator configured to produce an a.c. voltage Vout, a probe, and a resistor. Voltage Vout is coupled to an inductive coil of the probe connected in series with the resistor. An a.c. voltage Vmeas developed across the resistor is used to determine the response of the selected semiconductor die to the a.c. signal. A graph of the ratio of the magnitude of voltage Vmeas to the magnitude of voltage Vout versus the corresponding frequency of the a.c. electrical signal is plotted and used to determine the position of the die relative to other semiconductor dice produced from the same semiconductor wafer.

7 Claims, 10 Drawing Sheets

METHOD AND APPARATUS FOR IDENTIFYING THE POSITION OF A SELECTED SEMICONDUCTOR DIE RELATIVE TO OTHER DICE FORMED FROM THE SAME SEMICONDUCTOR WAFER

BACKGROUND OF THE INVENTION

1 Field of the Invention

This invention relates to semiconductor device manufacturing and more particularly to determining the position of a given semiconductor die relative to other dice formed from the same semiconductor wafer.

2. Description of the Relevant Art

Several semiconductor devices (e.g., integrated circuits) are typically formed upon a single semiconductor wafer during a series of semiconductor wafer fabrication operations. A semiconductor wafer has two opposed and substantially planar sides; a frontside surface and a backside surface. After a single-crystal ingot of a semiconductor material (e.g., silicon) has been grown, the ingot is sliced to form multiple wafers. A sequence of shaping and polishing steps are performed upon each wafer in order to produce frontside surfaces suitable for fabricating semiconductor devices. In contrast, the backside surfaces are typically subjected to mechanical damage by abrasion, grooving, or sandblasting during wafer manufacture in order to enhance the use of the frontside surface for the fabrication of semiconductor devices.

During wafer fabrication, the frontside surface of a semiconductor wafer is partitioned into rows and columns, forming separate die areas on the frontside surface. One or more semiconductor devices are formed within these die areas using a complex sequence of layering, patterning, doping, and heat treatment processes. Following wafer fabrication, the semiconductor devices formed within each die area are tested for proper operation. Die areas containing non-functional semiconductor devices are identified and either physically marked (e.g., with a drop of ink) or noted by an appropriate entry in a computer database. The semiconductor dice or "chips" are then separated from the semiconductor wafer by sawing between the defined die areas. Following an optical inspection to ensure the operational dice were not damaged during the sawing operation, each semiconductor die containing operational semiconductor devices is mounted within a protective semiconductor device package.

In order to increase the number of functional semiconductor devices produced using a given wafer fabrication process, semiconductor device failures must be diagnosed and corrective actions taken. The causes of such failures must be traced to a particular step in the wafer fabrication process, and preferably to a particular piece of equipment carrying out a particular operation. Such failure analysis is often possible only when a failed semiconductor device can be traced to the semiconductor wafer from which it was formed. Some failure mechanisms result in semiconductor device failures which are more prevalent in certain areas of the semiconductor wafer than in others. Such failure patterns are often distinctive, thereby helping to identify the cause. In these cases, the position of a failed semiconductor die relative to other semiconductor dice formed from the same semiconductor wafer is very valuable information.

Special markings are typically formed within each die area so that the wafer from which a selected semiconductor die was formed may be identified following separation of the die from the wafer. Such markings may be visually interpreted when viewed through a microscope or interpreted by a machine (e.g., a laser bar code reader). Optical interpretation by human or machine requires time to carefully align the semiconductor die for observation of the special markings. As a result, optical interpretation is a relatively slow process. In addition, user interpretation is subject to human error which increases with user fatigue.

It would be beneficial to have a method and apparatus for identifying a selected semiconductor die which involves electrical rather than optical interpretation. The desired electrical identification would not require careful alignment of a selected semiconductor die, resulting in a faster identification process. User interpretation would preferably not be required, eliminating the opportunity for human error.

SUMMARY OF THE INVENTION

The problems outlined above are in large part solved by an apparatus and method for identifying a semiconductor die within a group of semiconductor dice formed upon a surface of the same semiconductor wafer. During wafer fabrication, several parallel-resonant electronic structures are formed within a designated region of each die area of the semiconductor wafer. The parallel-resonant structures are configured such that each semiconductor die responds differently to an alternating current (a.c.) electrical signal. Following separation of the semiconductor dice from the wafer and from one another, a die identification operation is performed in order to determine the position of a selected die within the semiconductor wafer prior to separation. During the identification operation, an a.c. electrical signal is coupled to the parallel-resonant structures of the selected semiconductor die. The unique response of the parallel-resonant structures of the selected semiconductor die to the a.c. electrical signal is used to determine the position of the selected semiconductor die relative to other semiconductor dice formed from the same semiconductor wafer.

Multiple parallel-resonant ID structures are formed within an ID area within each die area of the semiconductor wafer during wafer fabrication. The multiple parallel-resonant ID structures within a given ID area are formed such that they uniquely identify the respective semiconductor die (i.e., uniquely establish the position of the respective semiconductor die within the semiconductor wafer prior to separation). The parallel-resonant ID structures are preferably manufactured concurrently with integrated circuits formed in other regions of the die areas. The electrical equivalent of each ID structure includes an inductor in parallel with a capacitor (i.e., a parallel L-C circuit). The inductor is preferably a planar inductor (e.g., a planar spiral inductor or a rectangular spiral inductor), and the capacitor is preferably a parallel-plate capacitor including a dielectric layer interposed between two electrically conductive layers. In one embodiment, the ID structures within each ID area are divided into subsets, each subset containing at least one ID structure. ID structures within a given subset are formed similarly and respond similarly to an a.c. electrical signal. ID structures within different subsets are formed differently and respond differently to the a.c. electrical signal. By varying the number of subsets within each ID area and the number of ID structures within each subset, each ID area formed upon a different semiconductor die can be made to respond differently to an external a.c. electrical signal.

For example, the ID structures within a given subset may be configured to have the same parallel resonant frequency which differs from parallel resonant frequencies of all other subsets. The greater the number of subsets, the greater the number of dissimilar parallel resonant frequencies. The greater the number of ID structures within a given subgroup, the greater the magnitude of the collective subgroup response to an a.c. electrical signal at the resonant frequency of the subset.

A die ID system of the present invention includes a remote ID unit and a probe. The remote ID unit includes a variable frequency oscillator configured to produce an a.c. voltage Vout and a resistor. The probe includes an inductive coil. A transmission line couples a.c. voltage Vout through the series combination of the inductive coil and the resistor. An a.c. voltage Vmeas developed across the resistor, resulting from a.c. current flowing through the inductive probe and the resistor, is used to determine the response of the selected semiconductor die to the a.c. signal.

The method of the present invention includes positioning the probe of the die ID system in close proximity to the selected semiconductor die such that the inductive coil of the probe couples a portion of a.c. voltage Vout to the inductor of each ID structure of the selected semiconductor die. The frequency of a.c. voltage Vout is varied between a predetermined minimum frequency fmin and a predetermined maximum frequency fmax. At each frequency of a.c. voltage Vout, the magnitudes of voltages Vout and Vmeas are measured and recorded.

When the frequency of a.c. voltage Vout is not equal to or very close to a parallel resonant frequency of any ID structure, a.c. current flows through the inductive coil of the probe substantially unimpeded, and the magnitude of voltage Vmeas developed across the resistor is substantially equal to the magnitude of voltage Vout. However, at frequencies equal to or very near parallel resonant frequencies of one or more ID structures, the flow of current through the inductive coil and the resistor is impeded due to the highly resistive impedances of the one or more ID structures, causing the magnitude of voltage Vmeas to be substantially less than the magnitude of voltage Vout.

A graph of the ratio of the magnitude of voltage Vmeas to the magnitude of voltage Vout versus the corresponding frequency of the a.c. electrical signal is plotted. A comparison of the resulting graph (i.e., frequency response graph or plot) to expected frequency response plots for each semiconductor die is then used to determine the identity of the semiconductor die (i.e., the position of the die relative to other semiconductor dice produced from the same semiconductor wafer).

BRIEF DESCRIPTION OF THE DRAWINGS

Other objects and advantages of the invention will become apparent upon reading the following detailed description and upon reference to the accompanying drawings in which.

Figure 1A:
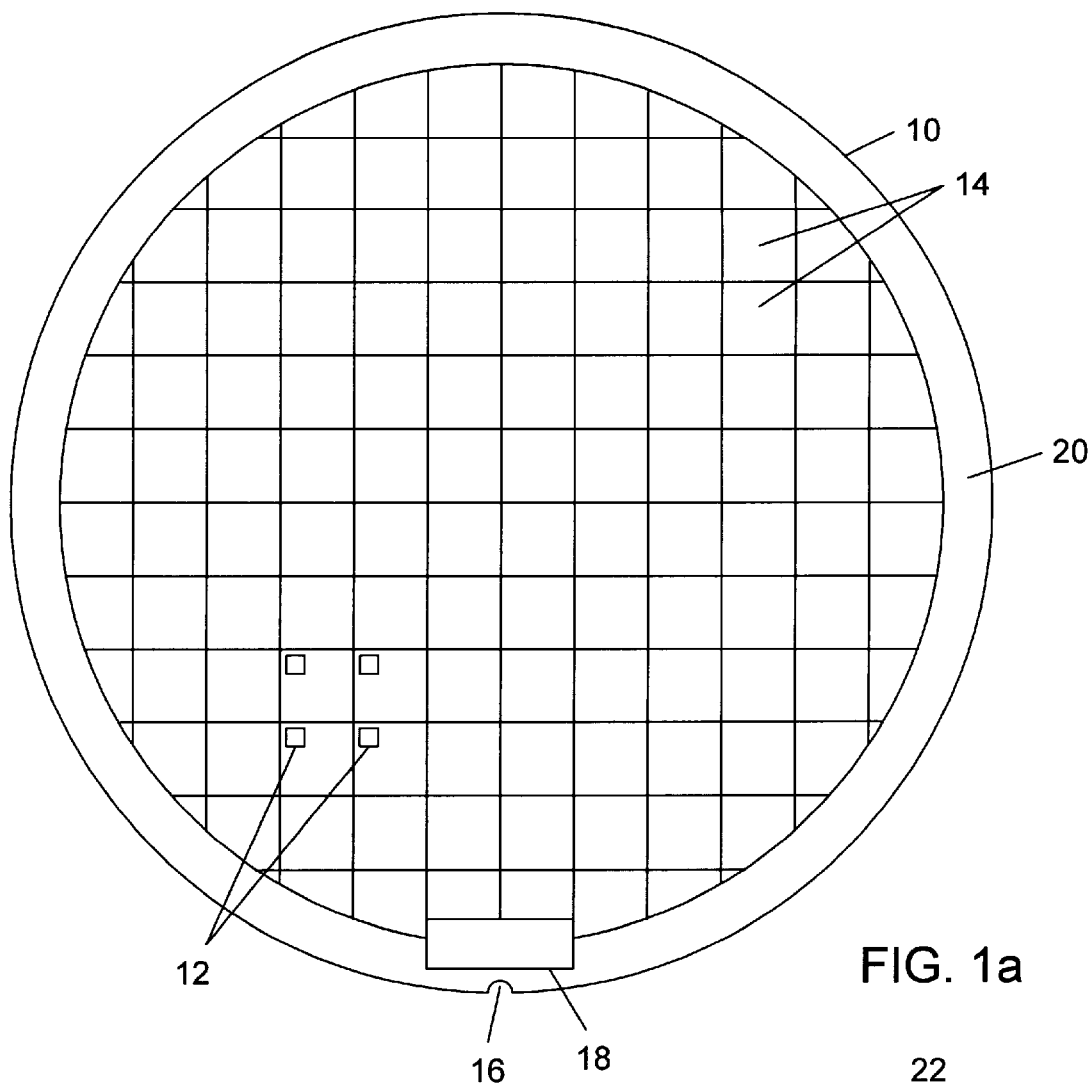
FIG. 1a is a top plan view of a frontside surface of a semiconductor wafer, wherein an identification (ID) area is formed within the boundaries of each of several die areas on the frontside surface of the semiconductor wafer in accordance with one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 1B:
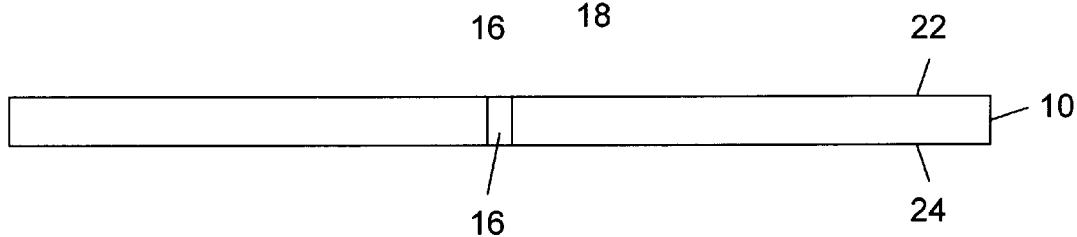
FIG. 1b is a side elevation view of the semiconductor wafer of FIG. 1a illustrating the orientation of the frontside surface to a backside surface of the semiconductor wafer.

FIG. 1a is a top plan view of a frontside surface of a semiconductor wafer 10 including identification (ID) areas 12 formed within the boundaries of multiple die areas 14 in accordance with one embodiment of the present invention. Semiconductor wafer 10 has two opposed and substantially planar sides; the frontside surface and a backside surface. FIG. 1b is a side elevation view of semiconductor wafer 10 illustrating the orientation of a frontside surface 22 to a backside surface 24. Current wafer fabrication processes form electronic devices upon and within specially-prepared frontside surfaces of semiconductor wafers. Following lapping and grinding processes, the frontside surface of a semiconductor wafer is typically subjected to a chemical-mechanical polishing step in order to produce a surface which is scratch and damage free.

During wafer fabrication, one or more semiconductor devices are formed upon frontside surface 22 of semiconductor wafer 10 within the boundaries of each die area 14. Following formations of the semiconductor devices, semiconductor wafer 10 is separated into individual dice. Semiconductor wafer 10 has a notch 16 which indicates the orientation of the crystalline structure. The manufacturer of semiconductor wafer 10 typically includes manufacturing data in a scribe area 18 on the frontside surface. The scribe area orientation shown is merely one example of numerous possible orientations. The manufacturing data may include, for example, the name of the manufacturing company, the date of manufacture, a serial number, and the type of dopant atoms incorporated into the crystalline structure (i.e., p-type or n-type). Semiconductor wafer 10 also typically includes an exclusion zone 20 around the outer periphery of the frontside surface in which electronic devices are not formed.

In the embodiment of FIG. 1a, a portion of the frontside surface within each die area 14 is reserved for an ID area 12. Several electronic structures are formed within each ID area 12 and used to identify the position of a selected die relative to the other die formed from semiconductor wafer 10. It is noted that the frontside surface is very valuable and largely reserved for semiconductor device structures. As a result, the portion of frontside surface 22 within each die area and available for ID area 12 is believed to be rather limited.

Figure 2:
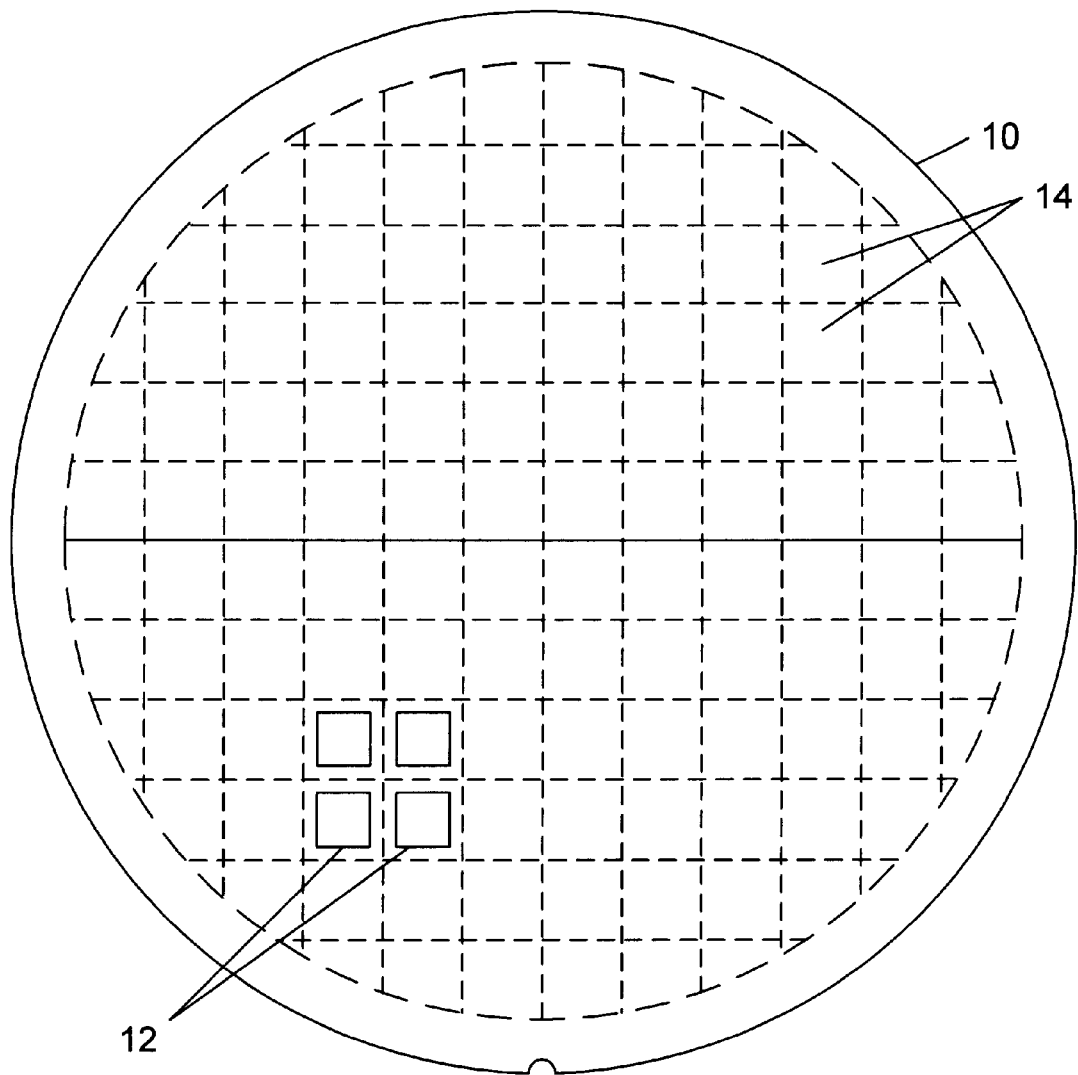
FIG. 2 is a top plan view of the backside surface of the semiconductor wafer of FIGS. 1a–b, wherein an ID area is formed within the boundaries of each of the several die areas on the backside surface of the semiconductor wafer accordance with an alternate embodiment of the present invention.

FIG. 2 is a top plan view of backside surface 24 of semiconductor wafer 10 including ID areas 12 formed within the boundaries of the multiple die areas 14 in accordance with an alternate embodiment. As semiconductor device structures are formed only upon and within frontside surface 22, virtually the entire portion of backside surface 24 within each die area is available for ID area 12. Hence it may be advantageous to locate ID areas 12 upon backside surface 24 of semiconductor wafer 10.

Figure 3:
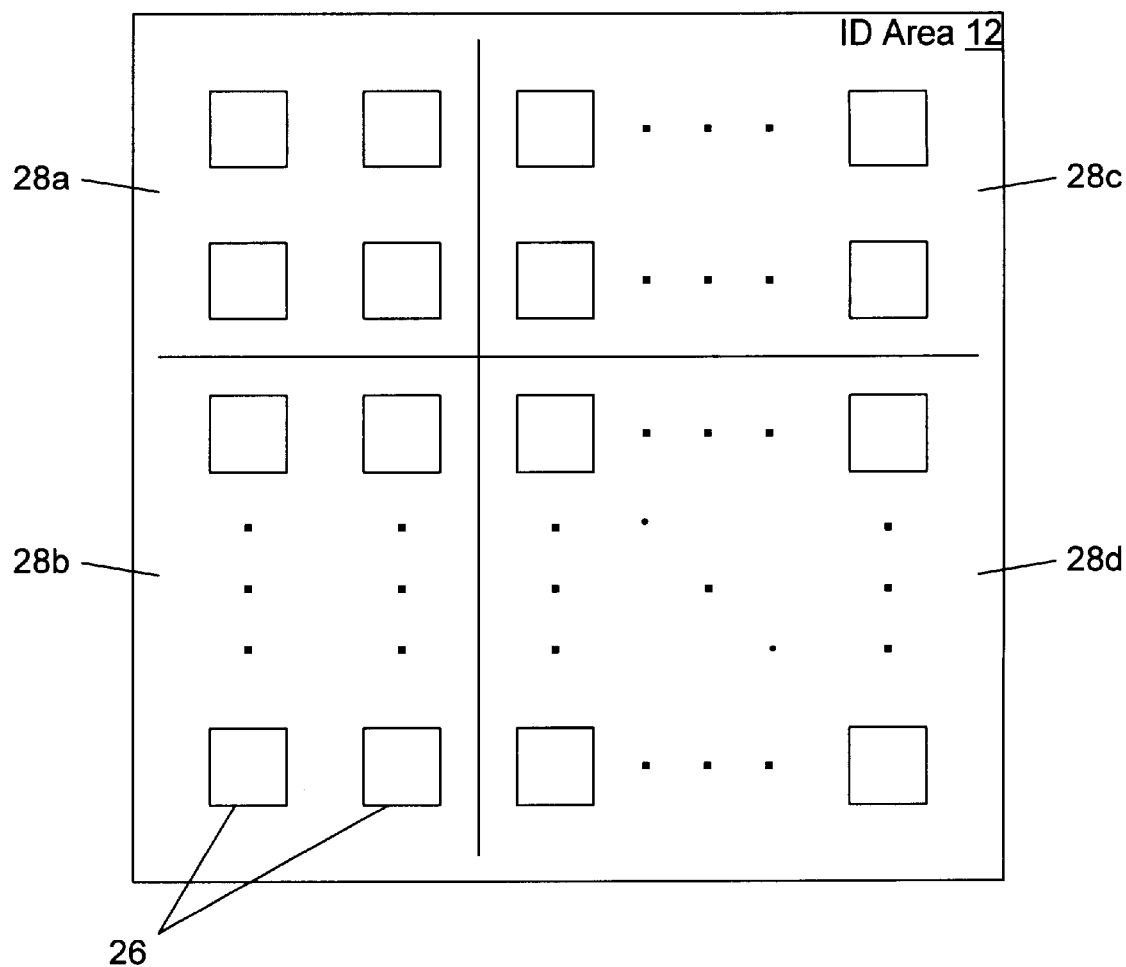
FIG. 3 is a top plan view of one embodiment of the ID area of FIGS. 1a–b and FIG. 2, wherein the ID area includes multiple ID structures arranged in a two-dimensional array, and wherein the ID structures are divided into subsets, and wherein ID structures within the same subset respond similarly, and ID structures within different subsets respond differently, to an alternating current (a.c.) electrical signal.

FIG. 3 is a top plan view of one embodiment of ID area 12. ID area 12 includes multiple ID structures 26. ID structures 26 may be arranged in a two-dimensional array. ID structures 26 are also divided into subsets, each subset containing at least one ID structure 26. ID structures 26 within each subset are formed such that they respond similarly to an alternating current (a.c.) electrical signal. ID structures 26 within different subsets are formed such that they respond differently to the a.c. electrical signal. For example, ID structures 26 in FIG. 3 are divided into four subsets 28a–d. The four ID structures within subset 28a are configured to respond similarly to an alternating current (a.c.) electrical signal, and to respond differently to the a.c. electrical signal than the ID structures within subsets 28b–d. By varying the number of subsets within each ID area 12 and the number of ID structures 26 within each subset, each ID area 12 formed upon different semiconductor die can be made to respond differently to an external a.c. electrical signal.

Die areas are typically defined in rows and columns to facilitate separation of the semiconductor dice from the semiconductor wafer by sawing. The position of a semiconductor die within a semiconductor wafer prior to separation may thus be defined in terms of a horizontal row number and a vertical column number of the corresponding die area. Alternately, die areas may be numbered according to various schemes. In any case, ID structures formed upon a given semiconductor die are configured such that the responses of the ID structures to an a.c. electrical signal uniquely determine the position of the semiconductor die within a semiconductor wafer prior to separation. Such a correlation or "mapping" is required in order to allow a subsequent determination of the position of the semiconductor die within the semiconductor wafer prior to separation from the wafer based upon the response of the ID structures to an a.c. electrical signal.

Figure 4:
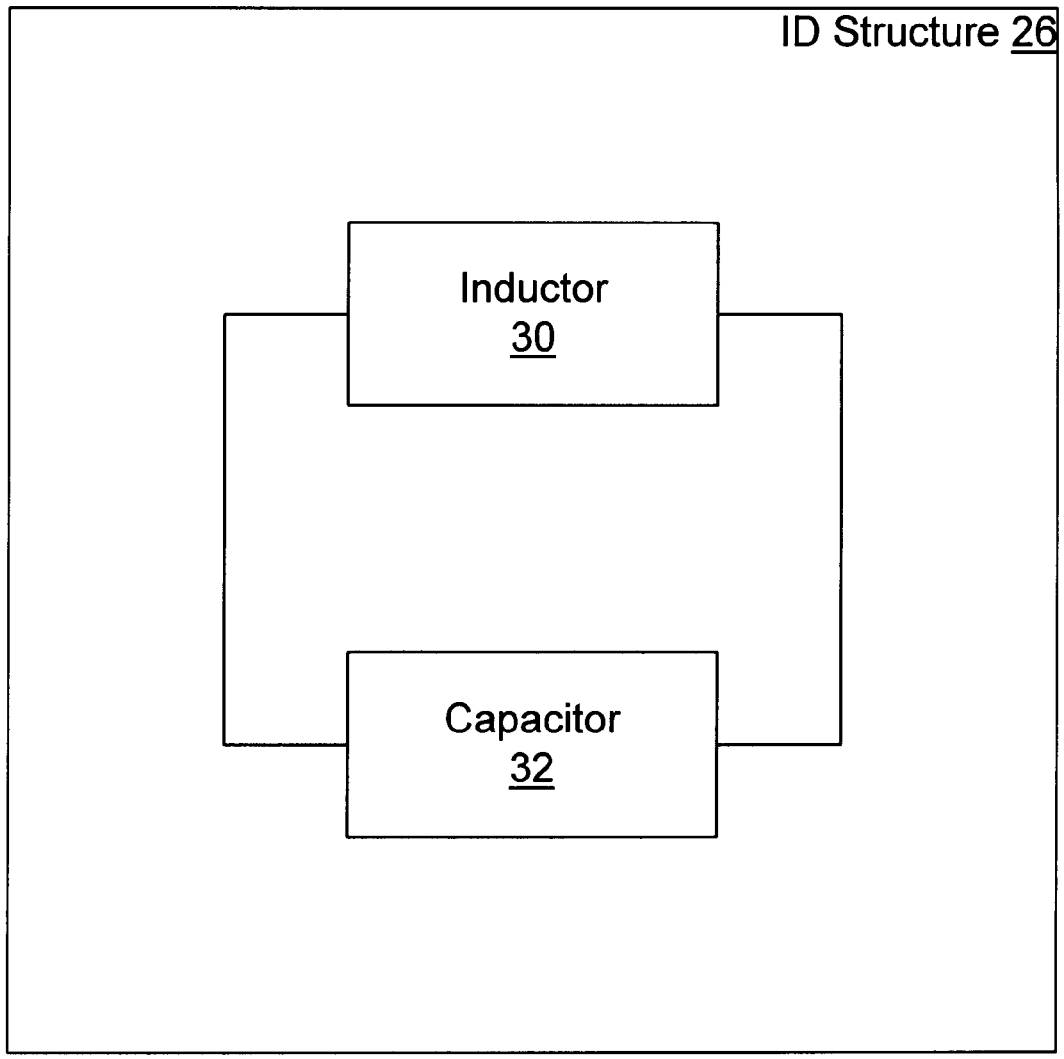
FIG. 4 is a block diagram of one embodiment of the ID structure of FIG. 3, wherein the ID structure includes an inductor and a capacitor connected in parallel.

FIG. 4 is a block diagram of one embodiment of ID structure 26. ID structure 26 includes an inductor 30 and a capacitor 32 connected in parallel. Inductor 30 stores electrical energy in a magnetic field, and capacitor 32 stores energy in an electric field. When an a.c. signal is applied to the parallel combination of inductor 30 and capacitor 32, the parallel combination will exhibit parallel resonance at a specific frequency of the a.c. electrical signal. At the resonant frequency of the parallel combination, the reactances of inductor 30 and capacitor 32 are equal and opposite, canceling each other out. The impedance of the parallel combination of inductor 30 and capacitor 32 is purely resistive and of relatively high magnitude at the resonant frequency.

Figure 5:
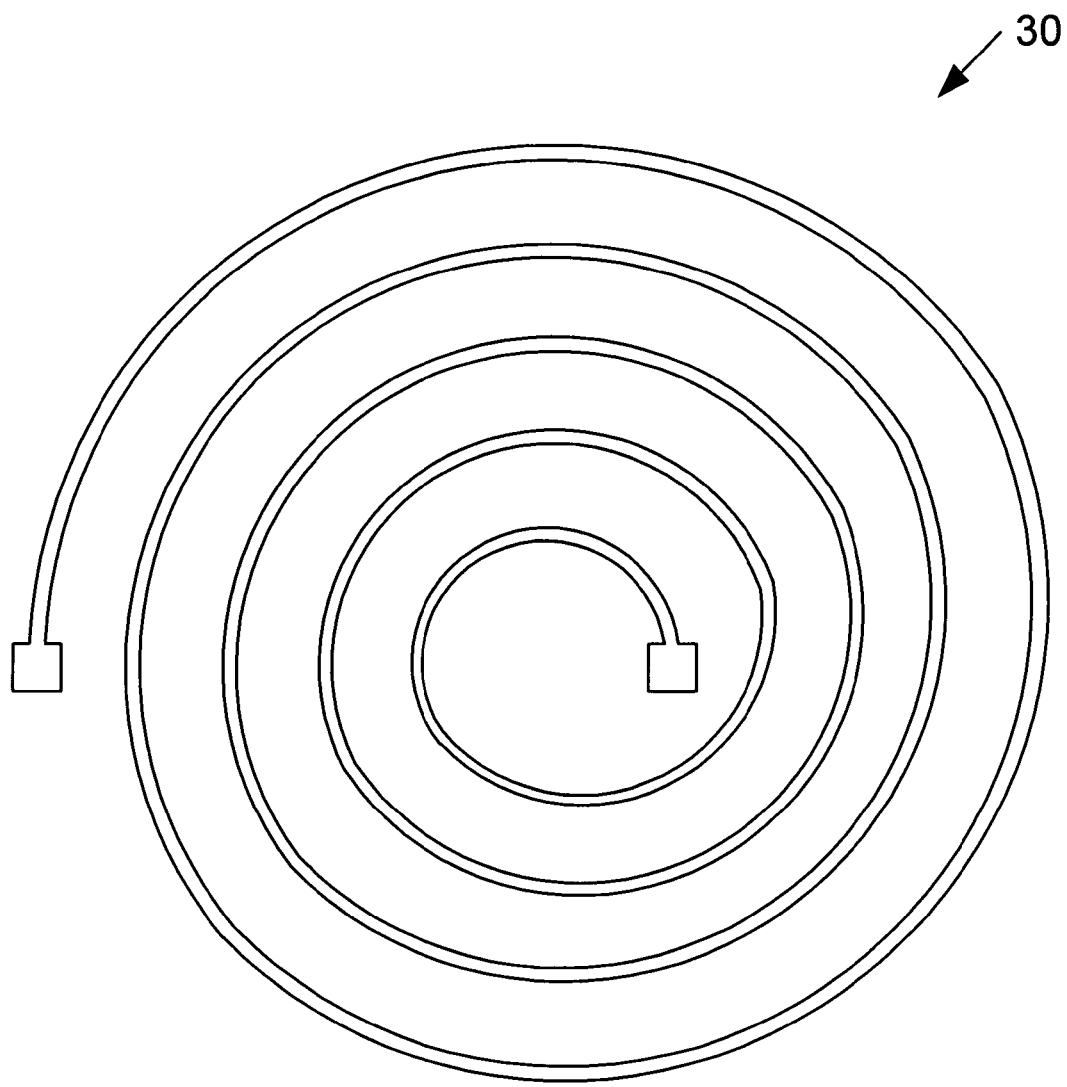
FIG. 5 is a top plan view of one embodiment of the inductor of FIG. 4, wherein the inductor is a planar spiral inductor.
Figure 6:
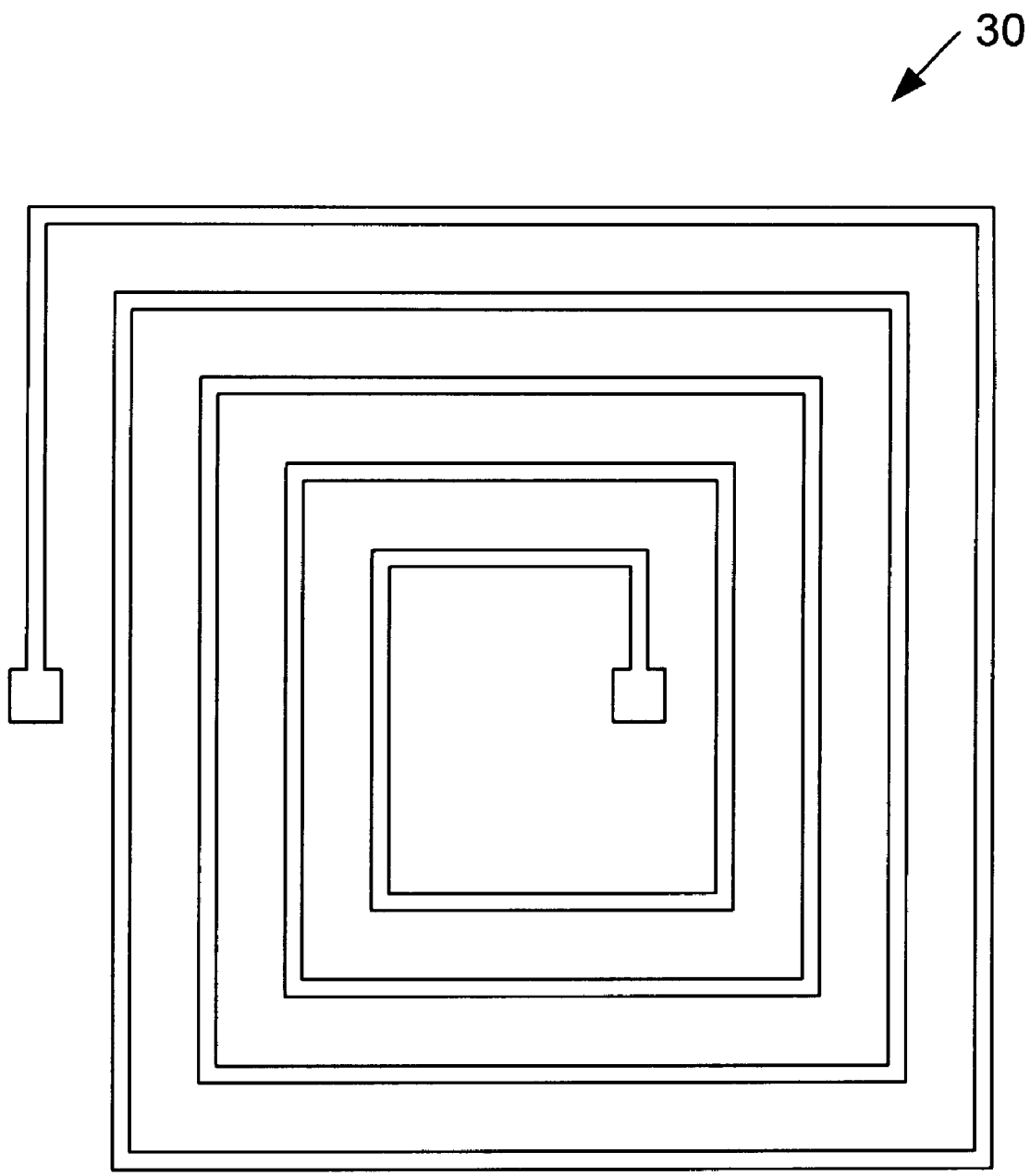
FIG. 6 is a top plan view of an alternate embodiment of the inductor of FIG. 4, wherein the inductor is a planar rectangular inductor.

Planar inductors are desirable for use in semiconductor devices as they are easily formed from a single layer of a conductive material. FIG. 5 is a top plan view of one embodiment of inductor 30 in which inductor 30 is a planar spiral inductor. The planar spiral inductor of FIG. 5 has 4.5 turns which exist in the same plane. For specific planar spiral inductor design information, see *Computer-Aided Design of Microwave Circuits* by K. C. Gupta et al., Artech House, Inc., 1981, pp. 209–212. FIG. 6 is a top plan view of an alternate embodiment of inductor 30 in which inductor 30 is a planar rectangular inductor. The planar rectangular inductor of FIG. 6 also has 4.5 turns which exist in the same plane. For specific planar rectangular inductor design information, see "Design of Planar Rectangular Microelectronic Inductors" by H. M. Greenhouse, *IEEE Transactions on Parts, Hybrids, and Packaging*, Vol. 10, No. Jun. 2, 1974, pp. 101–109.

Figure 7:
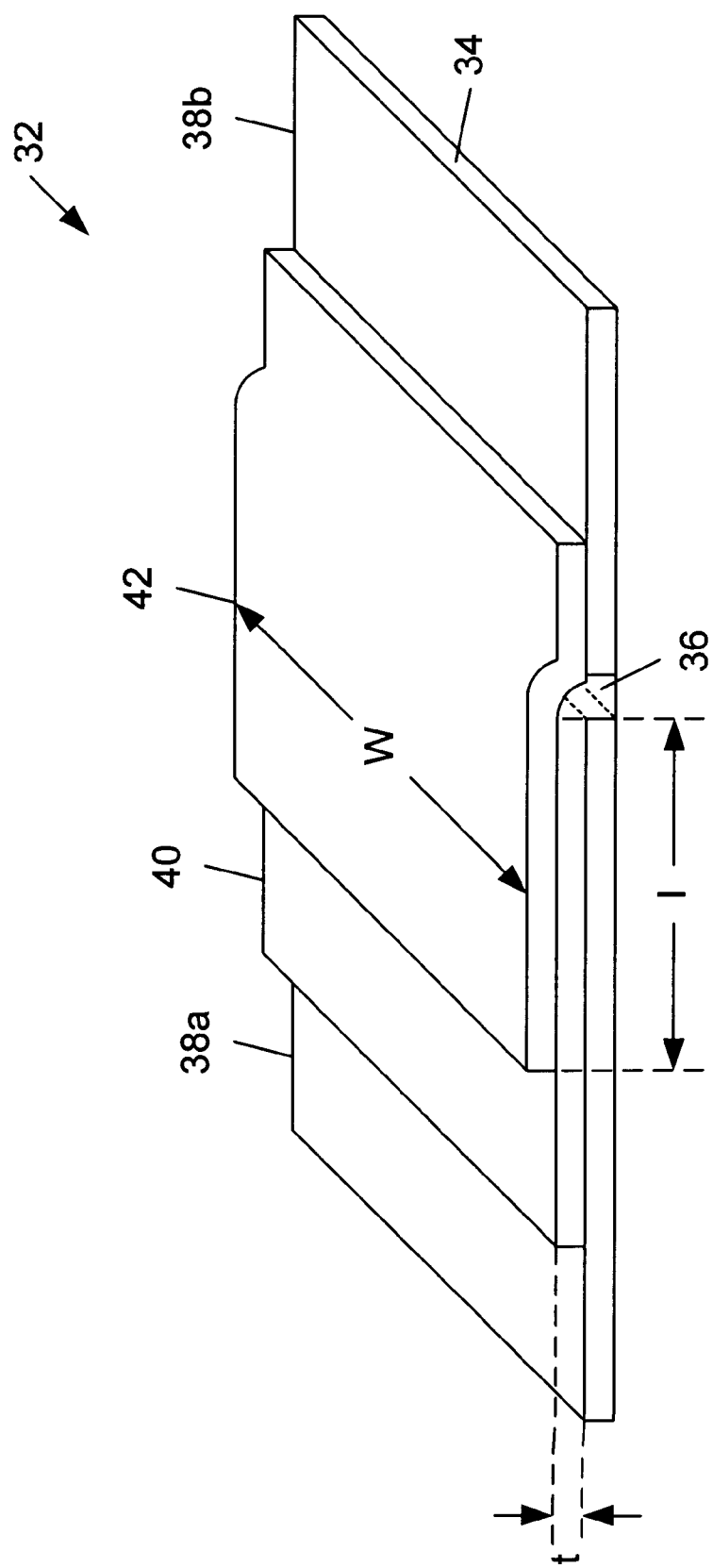
FIG. 7 is an isometric view of one embodiment of the capacitor of FIG. 4, wherein the capacitor is a parallel plate capacitor having a dielectric layer interposed between two electrically conductive layers.

Parallel plate capacitors are desirable for use in semiconductor devices, and are typically formed by depositing a layer of a dielectric material between two layers of conductive material. FIG. 7 is an isometric view of one embodiment of capacitor 32 in which capacitor 32 is a parallel plate capacitor. A first conductive layer 34 is formed upon an insulating substrate, and an opening 36 is formed which divides conductive layer 34 into two sections 38a and 38b. A layer of a dielectric material is deposited over a portion of section 38a and within opening 36. A second conductive layer 42 is then formed over a portion of dielectric layer 40 and an adjacent portion of section 38b. Capacitor 32 is thus formed between sections 38a and 38b of conductive layer 34. First conductive layer 34 and second conductive layer 42 may be made of, for example, aluminum. Dielectric layer 40 may be made of, for example, silicon dioxide. The achieved capacitance of capacitor 32 is directly proportional to width w of second conductive layer 42, length l of the overlap between second conductive layer 42 and section 38a, and the permittivity of dielectric layer 40, and is inversely proportional to thickness t of dielectric layer 40.

It is noted that a capacitance exists between the turns of planar inductors having more than one turn. Such capacitance is in parallel with the inductance of the turns. When an a.c. signal is applied to the planar inductor, the planar inductor will exhibit parallel resonance at a specific frequency of the a.c. electrical signal (i.e., a self-resonant frequency). Capacitor 32 of an ID structure 26 may thus be the inter-turn capacitance of a multi-turn inductor 30. In such cases, ID structure 26 may include only inductor 30 with no additional capacitor 32.

Figure 8:
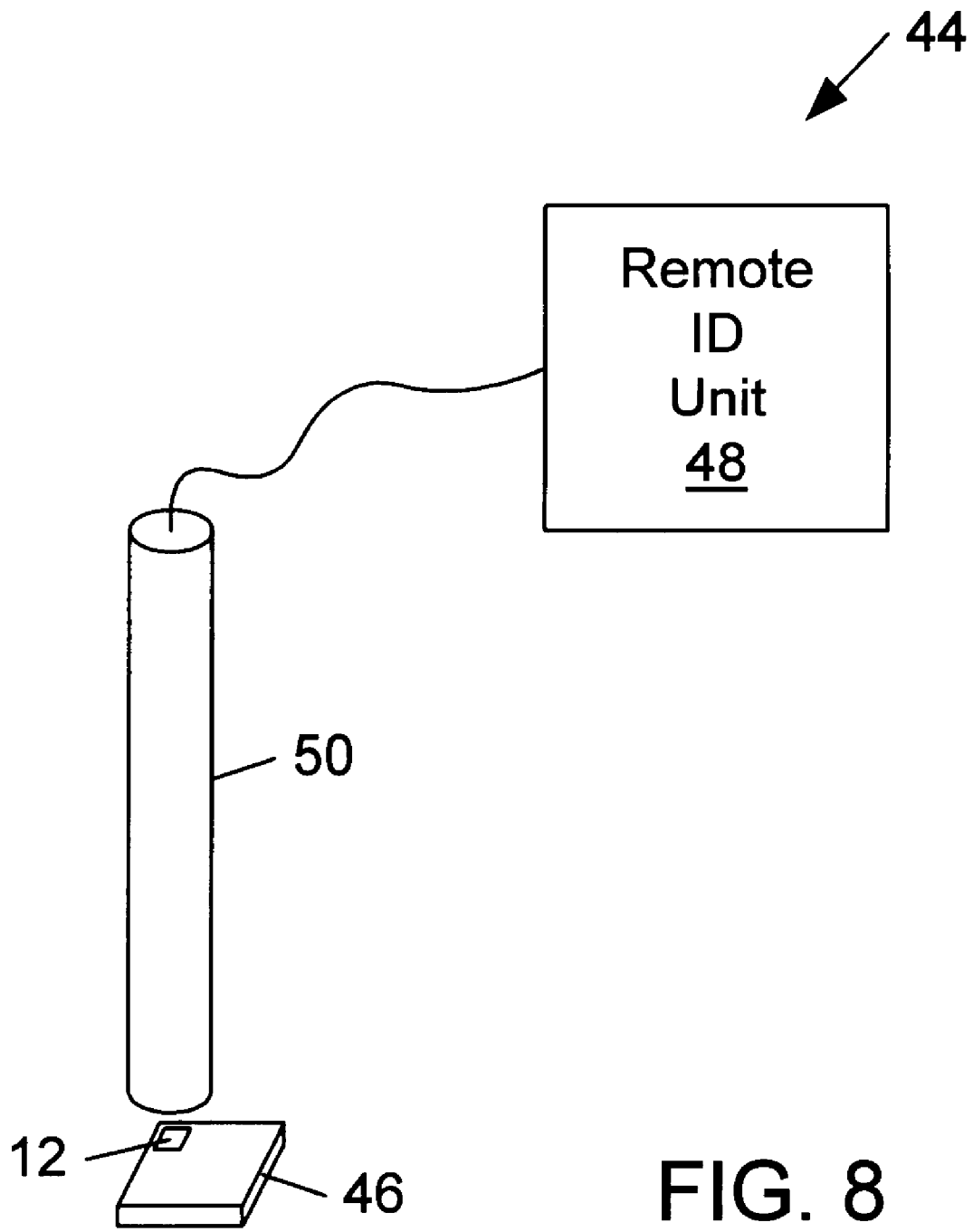
FIG. 8 is a diagram of a die ID system in accordance with the present invention, wherein the die ID system is used to identify the position of a selected semiconductor die relative to other semiconductor dice formed from the semiconductor wafer of FIGS. 1a–b and FIG. 2, and wherein the die ID system includes a remote ID unit coupled to a probe.

FIG. 8 is a diagram of a die ID system 44 used to identify the position of a selected semiconductor die 46 relative to other semiconductor dice formed from semiconductor wafer 10 in accordance with the present invention. Die ID system 44 includes a remote ID unit 48 coupled to a probe 50. During use of die ID system 44, probe 50 is positioned in proximity to ID area 12 on a surface of die 46. An a.c. signal generated by remote ID unit 48 is coupled to ID structures 26 within ID area 12 of a scribed die 46 (i.e., a die separated or removed from a wafer) via probe 50. The frequency of the a.c. signal is varied between a predetermined minimum frequency and a predetermined maximum frequency. Each ID structure 26 responds to the a.c. signal when the frequency of the a.c. signal is at or very near the resonant frequency of the ID structure 26. The responses of ID structures 26 to the a.c. signal are detected by probe 50 and transmitted to remote ID unit 48. Remote ID unit 48 measures the responses of ID structures 26 and determines from the responses the position of die 46 relative to the other semiconductor dice formed from semiconductor wafer 10.

Figure 9:
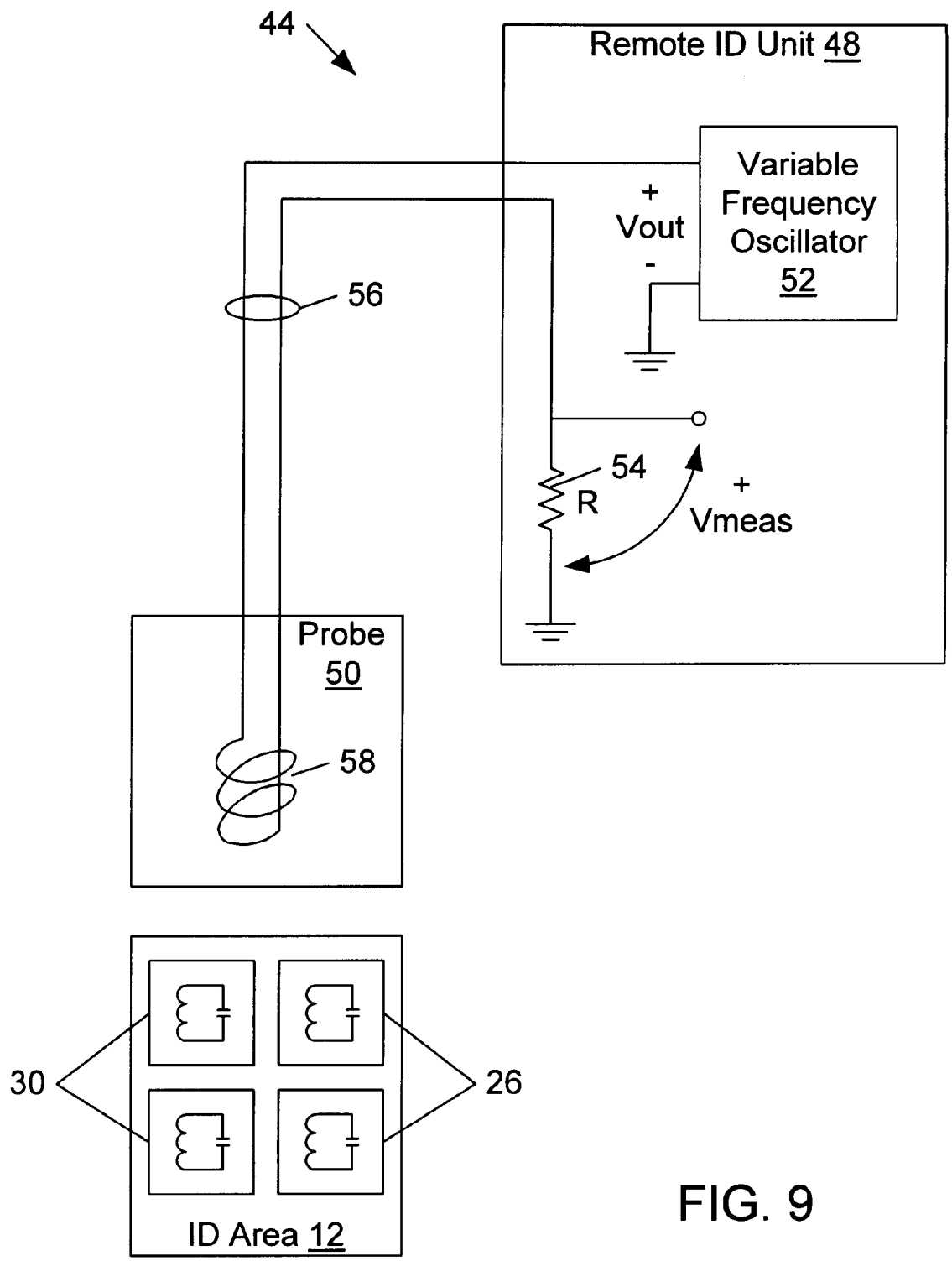
FIG. 9 is a block diagram of the die ID system of FIG. 8 during use, wherein the probe is positioned in proximity to the ID area of a selected semiconductor die and includes an inductive coil, and wherein a variable frequency oscillator within the remote ID unit produces an a.c. electrical signal, and wherein a portion of the a.c. signal is coupled to the ID structures within the ID area via the inductive coil.

FIG. 9 is a block diagram of ID system 44 during use. Remote ID unit 48 includes a variable frequency oscillator 52 and a resistor 54. Variable frequency oscillator 52 produces an a.c. voltage Vout at an output port. A transmission line 56 completes an electrical circuit between the output port of variable frequency oscillator 52 and resistor 54, wherein an a.c. current flows through transmission line 56 in response to a.c voltage Vout. Probe 50 includes an inductive coil 58. Inductive coil 58 is connected to transmission line 56 such that the a.c. current flows through inductive coil 58.

During use, inductive coil 58 of probe 50 is positioned in proximity to ID area 12 on a surface of a semiconductor die. The a.c. current flowing through inductive coil 58 creates a magnetic field surrounding inductive coil 58. Each inductor 30 of the multiple ID structures 26 within ID area 12 are subjected to a portion of the magnetic field surrounding inductive coil 58. The time-varying magnetic field surrounding each inductor 30 creates an a.c. voltage across the terminals of each inductor 30. The a.c. voltage induced within each inductor 30 is a portion of a.c. voltage Vout, and thus has the same frequency as a.c. voltage Vout.

During use, remote ID unit 48 preferably varies the frequency of a.c. voltage Vout between a predetermined minimum frequency fmin and a predetermined maximum frequency fmax. At each frequency of a.c. voltage Vout, remote ID unit 48 preferably measures the magnitudes of voltages Vout and Vmeas, then divides the magnitude of voltage Vmeas by the magnitude of voltage Vout and records the resulting ratio. When the frequency of a.c. voltage Vout is not equal to or very close to a parallel resonant frequency of any ID structure 26, the a.c. current flows through inductive coil 58 substantially unimpeded, and the magnitude of voltage Vmeas developed across resistor 54 is substantially equal to the magnitude of voltage Vout. However, at frequencies equal to or very near parallel resonant frequencies of one or more ID structures 26, the flow of a.c. current through inductive coil 58 is impeded due to the highly resistive impedances of the one or more ID structures 26, causing the magnitude of voltage Vmeas to be substantially less than the magnitude of voltage Vout.

Remote ID unit 48 preferably plots a graph of the ratio of magnitude of voltage Vmeas to the magnitude of voltage Vout versus the corresponding frequency. The resulting graph (i.e., frequency response graph or plot) is then used to determine the identity of the semiconductor die (i.e., the position of the die relative to other semiconductor dice produced from the same semiconductor wafer). Remote ID unit 48 preferably compares the graph to stored information regarding the expected frequency response of each semiconductor die. When a match is found, the identity of the die is determined. Alternately, a user may compare the graph produced by remote ID unit 48 to graphs of the expected frequency response of each semiconductor die in order to determine the identity of the die.

Figure 10:
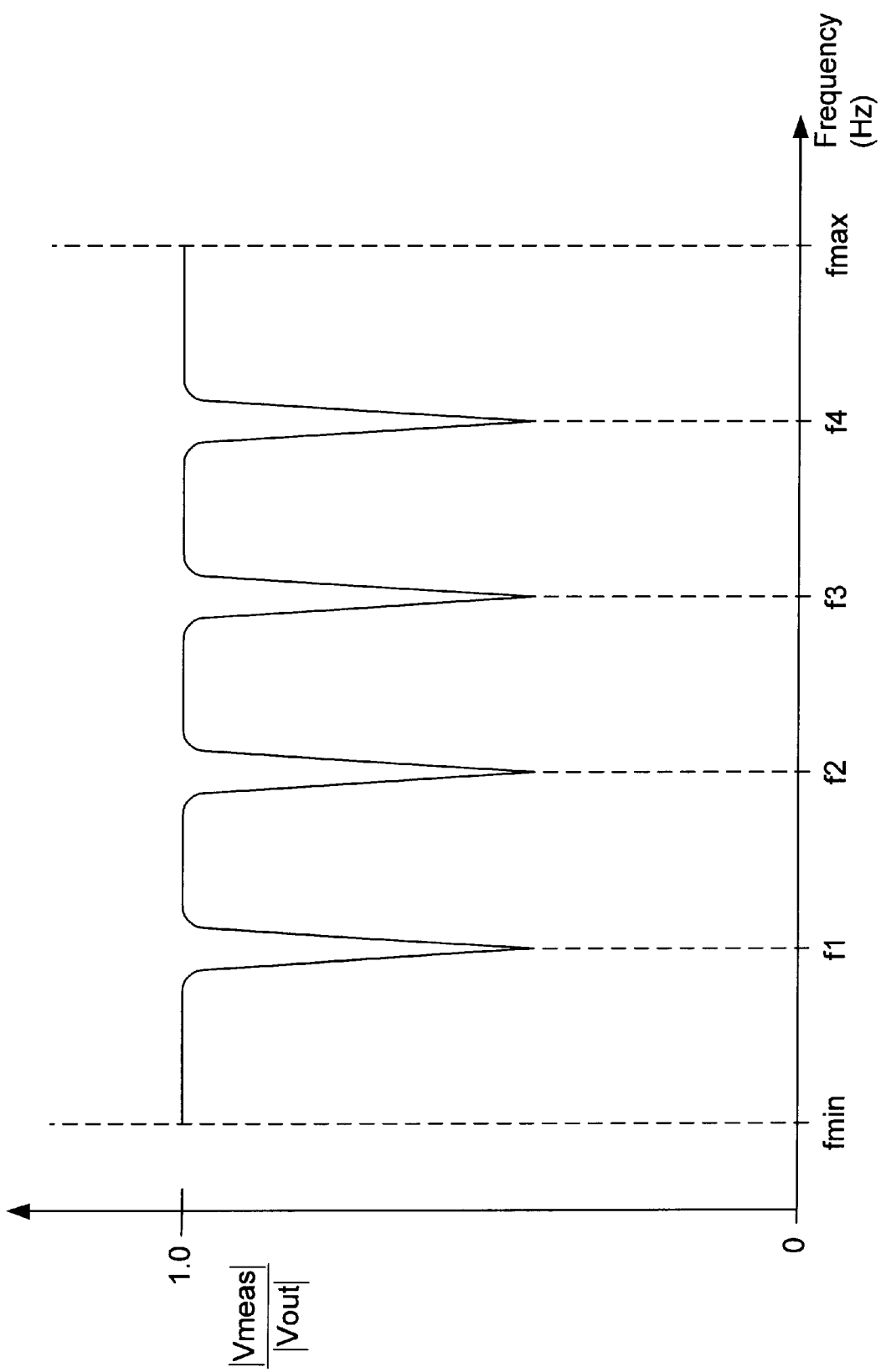
FIG. 10 is an example of one possible frequency response plot resulting from the configuration of FIG. 9, wherein the frequency response plot may be used to determine the position of the selected semiconductor die relative to other die formed from the same semiconductor wafer.

FIG. 10 is an example of one possible frequency response plot resulting from the configuration shown in FIG. 9. The graph of FIG. 10 is produced by varying the frequency of a.c. voltage Vout, produced by variable frequency oscillator 52, between the predetermined minimum frequency fmin and the predetermined maximum frequency fmax. At each frequency of a.c. voltage Vout, the ratio of the magnitude of voltage Vmeas to the magnitude of voltage Vout is determined. The graph of FIG. 10 is produced when ID area 12 in FIG. 9 is divided into four subsets, each subset including a single ID structure 26. Each ID structure 26 has a different parallel resonant frequency, and the parallel resonant frequencies are substantially evenly spaced within the frequency range extending from fmin to fmax. The parallel resonant frequencies of the four ID structures 26 shown in FIG. 9 correspond to the reductions in the magnitude of the ratio of voltage Vmeas to voltage Vout (i.e., "notches" in the frequency response plot) at frequencies f1,f2,f3, andf4 in FIG. 10.

It is noted that when an ID area 12 is divided into n subgroups, and each ID structure 26 within a given subgroup has the same parallel resonant frequency between frequency fmin and frequency fmax, the frequency response plot will have n distinct notches at the n corresponding parallel resonant frequencies. Adding an ID structure 26 to a given subgroup will further reduce the ratio of the magnitude of voltage Vmeas to the magnitude of voltage Vout at the corresponding parallel resonant frequency (i.e., "deepen" the corresponding notch). Similarly, removing an ID structure 26 from a given subgroup will increase the ratio of the magnitude of voltage Vmeas to the magnitude of the voltage Vout at the corresponding parallel resonant frequency. It is also noted that it is possible to purposely form ID structures which have parallel resonant frequencies outside the frequency range extending from frequency fmin to frequency fmax.

ID system 44 may also be used to record the responses of ID structures formed within die areas prior to separation of dice from the wafer. A mapping of response to die position within the wafer is simultaneously accomplished using this approach. Following separation of the dice from the wafer and from each other, a selected die may be identified by comparing its response to responses recorded prior to separation of the dice from the wafer.

It will be appreciated by those skilled in the art having the benefit of this disclosure that this invention is believed to be a method and apparatus for identifying the position of a selected semiconductor die relative to other semiconductor dice formed from the same semiconductor wafer. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. An apparatus for identifying a semiconductor die within a set of semiconductor dice formed from a semiconductor wafer, comprising:

a variable frequency oscillator configured to produce an a.c. electrical signal at an output port and configured to vary a frequency of the a.c. electrical signal over a selected range of frequencies; and a probe comprising an inductive coil, wherein during use the inductive coil is connected to the output port of the oscillator, and wherein during use the inductive coil is configured to be placed in close proximity to a selected semiconductor die such that the a.c. electrical signal produced by the variable frequency oscillator is coupled to a plurality of parallel-resonant structures formed upon a surface of the selected semiconductor die and such that the probe detects a response to the a.c. electrical signal from each of the structures.

2. The apparatus as recited in claim 1, wherein during use the variable frequency oscillator is configured to vary the frequency of the a.c. electrical signal between a predetermined minimum frequency and a predetermined maximum frequency.

3. The apparatus as recited in claim 1, further comprising a resistor connected in series with the inductive coil and configured to develop an electrical voltage thereacross when an a.c. electrical signal produced by the variable frequency oscillator is coupled to the plurality of parallel-resonant structures, wherein a magnitude of the electrical voltage developed across the resistor over the selected range of frequencies of the a.c. electrical signal is dependent upon a response of each of the structures to the a.c. electrical signal.

4. The apparatus as recited in claim 3, wherein the magnitude of the electrical voltage developed across the resistor over the selected range of frequencies of the a.c. electrical signal during use is indicative of the selected semiconductor die.

5. An apparatus for identifying a semiconductor die within a set of semiconductor dice formed from a semiconductor wafer, comprising:

a variable frequency oscillator configured to produce an a.c. electrical signal at an output port and configured to vary a frequency of the a.c. electrical signal over a selected range of frequencies;

a probe comprising an inductive coil; and a resistor;

wherein during use the inductive coil and the resistor are serially connected to the output port of the oscillator, and wherein during use the inductive coil is configured to be placed in close proximity to a selected semiconductor die such that the a.c. electrical signal is coupled to a plurality of parallel-resonant structures formed upon a surface of the selected semiconductor die such that an electrical voltage is developed across the resistor over the selected range of frequencies, the electrical voltage having a magnitude indicative of the selected semiconductor die.

6. The apparatus as recited in claim 5, wherein the oscillator is configured to vary the frequency of the a.c. electrical signal over a selected range of frequencies extending from a predetermined minimum frequency to a predetermined maximum frequency.

7. The apparatus as recited in claim 6, further comprising a transmission line serially connecting the inductive coil and the resistor to the output port of the oscillator.

* * * * *